United States Patent
Ferguson et al.

(10) Patent No.: US 10,089,432 B2
(45) Date of Patent: Oct. 2, 2018

(54) RULE-CHECK WAIVER

(75) Inventors: John G. Ferguson, Tualatin, OR (US); Jonathan J. Muirhead, Tigard, OR (US); Bikram Garg, Patiala (IN)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/304,094

(22) Filed: Nov. 23, 2011

(65) Prior Publication Data
US 2012/0167028 A1    Jun. 28, 2012

Related U.S. Application Data

(63) Continuation-in-part of application No. 12/954,601, filed on Nov. 24, 2010, now abandoned, which is a continuation of application No. 12/611,931, filed on Nov. 3, 2009.

(60) Provisional application No. 61/264,245, filed on Nov. 24, 2009, provisional application No. 61/110,919, filed on Nov. 3, 2008.

(51) Int. Cl.
G06F 17/00   (2006.01)
G06F 17/50   (2006.01)

(52) U.S. Cl.
CPC ................... *G06F 17/5081* (2013.01)

(58) Field of Classification Search
USPC ........................................... 716/136
See application file for complete search history.

(56) References Cited

U.S. PATENT DOCUMENTS

| | | | |
|---|---|---|---|
| 5,706,295 A | 1/1998 | Suzuki | |
| 6,189,132 B1 | 2/2001 | Heng et al. | |
| 6,418,551 B1* | 7/2002 | McKay et al. | 716/112 |
| 7,017,141 B2* | 3/2006 | Anderson et al. | 716/52 |
| 7,503,029 B2 | 3/2009 | Sinha et al. | |
| 7,653,892 B1 | 1/2010 | Gennari et al. | |
| 7,676,077 B2 | 3/2010 | Kulkarni et al. | |
| 7,941,768 B1* | 5/2011 | Wei | 716/54 |

(Continued)

OTHER PUBLICATIONS

Petition to Accept Unintentionally Delayed Benefit Claim Under 35 U.S.C. §§ 1.78(c) and 1.78(e) filed with the U.S. Patent and Trademark Office on Dec. 22, 2017, for U.S. Appl. No. 13/304,094, 2 pages.

(Continued)

*Primary Examiner* — Mohammed Alam

(57) ABSTRACT

When a designer designates one or more errors identified in layout design data as false errors, waiver geometric elements corresponding to the designated false errors are created and added to the design. The waiver geometric element may be associated with a verification rule that generated its corresponding false error. When the design is subsequently analyzed using those verification rules in another verification rule check process, the waiver geometric elements are examined, and used to mask those errors associated with a waiver geometric element that would otherwise be displayed to the designer. A designer may also designate a waiver region based on pattern matching, cell names or layout markers in which layout region one or more verification rules may be inapplicable. A waiver region identification item for the waiver region may be associated with a waiver geometric element and the one or more verification rules.

20 Claims, 3 Drawing Sheets

(56) References Cited

U.S. PATENT DOCUMENTS

| | | |
|---|---|---|
| 8,091,055 B2 * | 1/2012 | Brelsford et al. ............ 716/111 |
| 8,151,234 B2 * | 4/2012 | Berkens et al. ............. 716/119 |
| 8,407,627 B2 * | 3/2013 | Pack et al. ...................... 716/50 |
| 2005/0086619 A1 | 4/2005 | Teh et al. |
| 2005/0188336 A1 | 8/2005 | Mortensen et al. |
| 2007/0192754 A1 | 8/2007 | Hofsaess |
| 2008/0066047 A1 | 3/2008 | Heng et al. |
| 2008/0148211 A1 | 6/2008 | Dai et al. |
| 2009/0193386 A1 * | 7/2009 | Hirai .............................. 716/20 |
| 2010/0192113 A1 * | 7/2010 | Brelsford ............ G06F 17/5081 716/52 |
| 2010/0257496 A1 * | 10/2010 | Ferguson et al. ................. 716/5 |
| 2012/0047479 A1 * | 2/2012 | Paris .................. G06F 17/5081 716/112 |

OTHER PUBLICATIONS

Decision on Petition under 37 C.F.R. § 1.78(c) and (e) dated Jan. 22, 2018, 3 pages.

Petition to Accept Unintentionally Delayed Benefit Claim Under 35 U.S.C. §§ 1.78(c) and 1.78(e) filed with the U.S. Patent and Trademark Office on May 11, 2018, for U.S. Appl. No. 13/304,094, 2 pages.

Decision on the Renewed Petition Under 37 CFR 1.78(c) and (e) dated Jun. 5, 2018 which was granted, 2 pages.

\* cited by examiner

RULE-CHECK WAIVER

RELATED APPLICATIONS

This application is a continuation-in-part of U.S. patent application No. 12/954,601, entitled "Design-Rule-Check Waiver," filed on Nov. 24, 2010, and naming John G. Ferguson et al. as inventors, which application claims the benefit of U.S. Provisional Patent Application No. 61/264,245, entitled "Design-Rule-Check Waiver Flow," filed on Nov. 24, 2009, and naming John G. Ferguson as inventor. Also, this application is a continuation-in-part of U.S. patent application Ser. No. 12/611,931, entitled "Design-Rule-Check Waiver," filed on Nov. 3, 2009, and naming John G. Ferguson et al. as inventors, which application claims the benefit of U.S. Provisional Patent Application No. 61/110,919, entitled "Design-Rule-Check Waiver," filed on Nov. 3, 2008, and naming John G. Ferguson as inventor. The entire disclosure of the prior applications is incorporated herein by reference.

The U.S. patent application Ser. No. 12/611,931 in turn claimed priority under 35 U.S.C. § 119 to U.S. to Provisional Patent Application No. 61/110,919, entitled "Design-Rule-Check Waiver," filed on Nov. 3, 2008, and naming John G. Ferguson as inventor.

Each of the above applications is incorporated entirely herein by reference.

FIELD OF THE INVENTION

The present invention is directed to the physical verification of integrated circuit designs. Various aspects of the invention may be particularly suitable for waiving false errors reported during a physical verification electronic design automation process.

BACKGROUND OF THE INVENTION

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit being designed, its complexity, the design team, and the microcircuit fabricator or foundry that will manufacture the microcircuit. Typically, software and hardware "tools" will verify a design at various stages of the design flow by running software simulators and/or hardware emulators, and errors in the design are corrected.

Several steps are common to most design flows. Initially, the specification for the new microcircuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logical of the circuit is then analyzed, to confirm that the logic incorporated into the design will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This logical generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the functions desired for the circuit. This analysis is sometimes referred to as "formal verification."

Once the relationships between circuit devices have been established, the design is again transformed, this time into a physical design that describes specific geometric elements. This type of design often is referred to as a "layout" design. The geometric elements define the shapes that will be created in various materials to actually manufacture the circuit device components (e.g., contacts, gates, etc.) making up the circuit. While the geometric elements are typically polygons, other shapes, such as circular and elliptical shapes, also may be employed. These geometric elements may be custom designed, selected from a library of previously-created designs, or some combination of both. Geometric elements also are added to form the connection lines that will interconnect these circuit devices. Layout tools (often referred to as "place and route" tools), such as Mentor Graphics' IC Station or Cadence's Virtuoso, are commonly used for both of these tasks.

With a layout design, each physical layer of the microcircuit will have a corresponding layer representation, and the geometric elements described in a layer representation will define the relative locations of the circuit device components that will make up a circuit device. Thus, the geometric elements in the representation of an implant layer will define the regions where doping will occur, while the geometric elements in the representation of a metal layer will define the locations in a metal layer where conductive wires used will be formed to connect the circuit devices. Typically, a designer will perform a number of analyses on the layout design. For example, the layout design may be analyzed to confirm that it accurately represents the circuit devices and their relationships described in the device design. The layout design also may be analyzed to confirm that it complies with various design requirements, such as minimum spacings between geometric elements. Still further, it may be modified to include the use of redundant or other compensatory geometric elements intended to counteract limitations in the manufacturing process, etc.

After the layout design has been finalized, then it is converted into a format that can be employed by a mask or reticle writing tool to create a mask or reticle for use in a photolithographic manufacturing process. Masks and reticles are typically made using tools that expose a blank reticle to an electron or laser beam. Most mask writing tools are able to only "write" certain kinds of polygons, however, such as right triangles, rectangles or other trapezoids. Moreover, the sizes of the polygons are limited physically by the maximum beam aperture size available to the tool. Accordingly, larger geometric elements in the layout design, or geometric elements that are not basic right triangles, rectangles or trapezoids (which typically is a majority of the geometric elements in a layout design) must be "fractured" into the smaller, more basic polygons that can be written by the mask or reticle writing tool.

During the physical verification process, various errors are typically detected. For example, a "design-rule-check"

process or a "design-for-manufacturing" process may identify an error where, e.g., adjacent geometric elements in a design are placed more closely than specified design verification rules allow. In some instances, however, the errors themselves may be erroneous. For example, a verification rule provided by a foundry may require a minimum distance between two adjacent geometric elements in a design. A designer at a circuit design company, however, may nonetheless wish to position the two geometric elements in a design more closely than the minimum distance for reasons that were not anticipated by the foundry. Accordingly, the designer may choose to "waive" the error created by the close proximity of the two geometric elements in the design. Each time that the designer employs the minimum-width design rule to physically verify the design, however, the proximity error will be generated again and must again be waived by the designer. Moreover, if the design company provides the design to one or more of its customers in, e.g., a larger circuit design, then those customers will also generate the proximity error when they physically verify the design. In order to confirm that the error should indeed be waived, each of the customers may contact the design company that provided the design, the foundry that provided the verification rule generating the error, or both.

A designer may also designate a waiver region based on pattern matching, cell names or layout markers in which layout region one or more verification rules may be inapplicable. A waiver region identification item for the waiver region may be associated with a waiver geometric element and the one or more verification rules.

DETAILED DESCRIPTION OF THE INVENTION

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
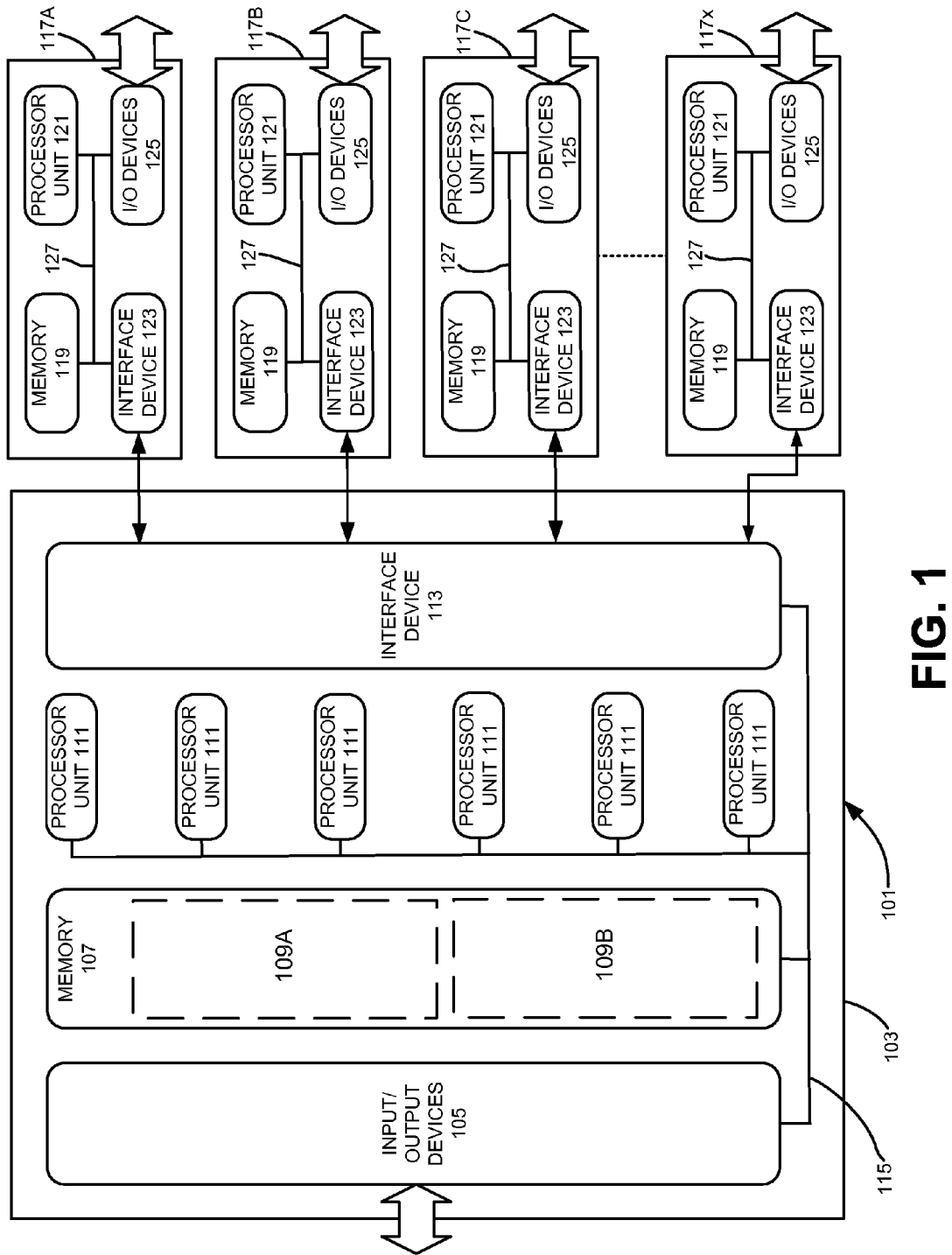
FIG. 1 illustrates an example of a computing system that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
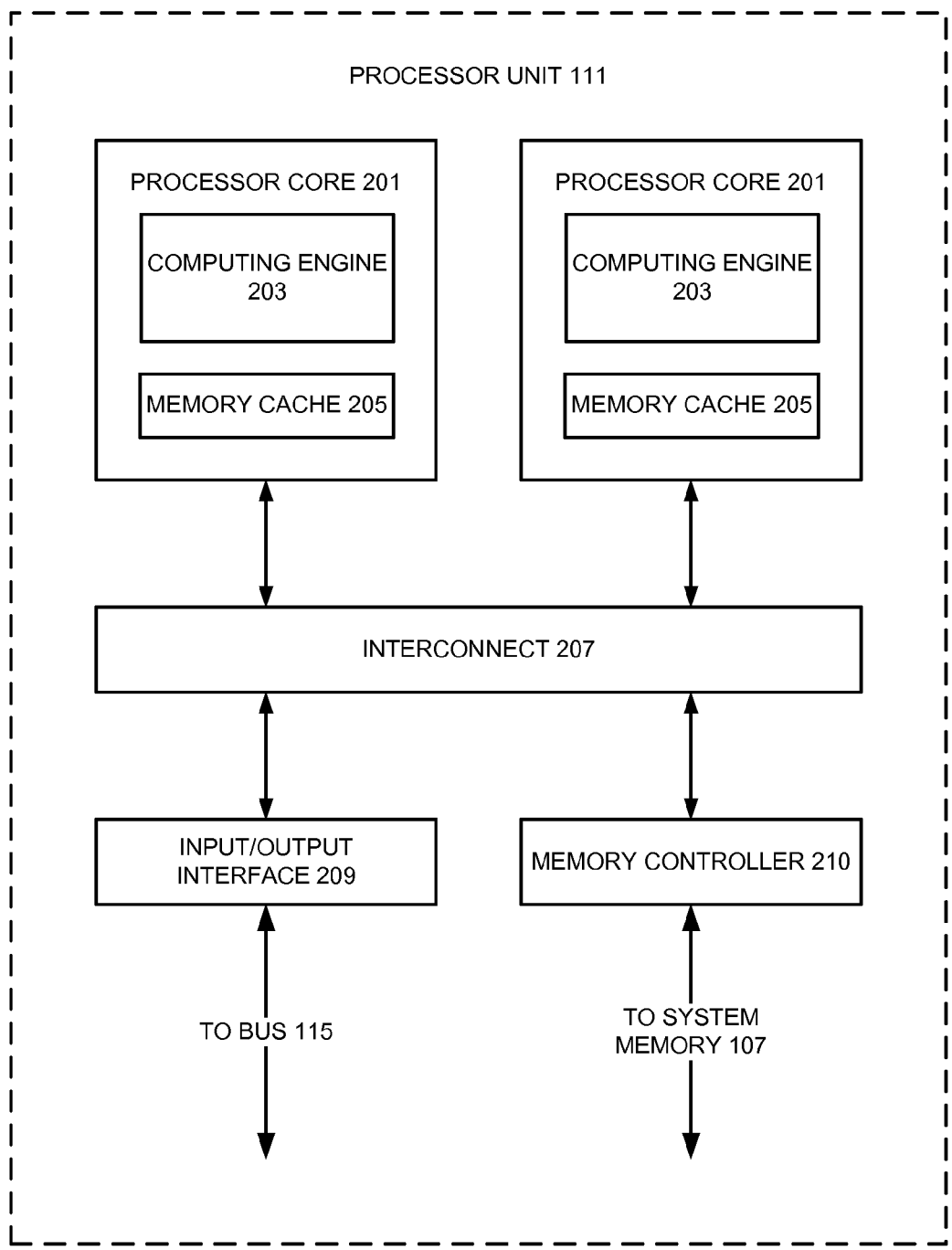
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Electronic Design Automation

As previously noted, various embodiments of the invention are related to electronic design automation. In particular, various implementations of the invention may be used to improve the operation of electronic design automation software tools that identify, verify and/or modify design data for manufacturing a microdevice, such as a microcircuit. As used herein, the terms "design" and "design data" are intended to encompass data describing an entire microdevice, such as an integrated circuit device or micro-electro-mechanical system (MEMS) device. This term also is intended to encompass a smaller set of data describing one or more components of an entire microdevice, however, such as a layer of an integrated circuit device, or even a portion of a layer of an integrated circuit device. Still further, the terms "design" and "design data" also are intended to encompass data describing more than one microdevice, such as data to be used to create a mask or reticle for simultaneously forming multiple microdevices on a single wafer. It should be noted that, unless otherwise specified, the term "design" as used herein is intended to encompass any type of design, including both a physical layout design and a logical design.

Designing and fabricating microcircuit devices involve many steps during a 'design flow' process. These steps are highly dependent on the type of microcircuit, its complexity, the design team, and the fabricator or foundry that will manufacture the microcircuit from the design. Several steps are common to most design flows, however. First, a design specification is modeled logically, typically in a hardware design language (HDL). Once a logical design has been created, various logical analysis processes are performed on the design to verify its correctness. More particularly, software and hardware "tools" verify that the logical design will provide the desired functionality at various stages of the design flow by running software simulators and/or hardware emulators, and errors are corrected. For example, a designer may employ one or more functional logic verification processes to verify that, given a specified input, the devices in a logical design will perform in the desired manner and provide the appropriate output.

In addition to verifying that the devices in a logic design will provide the desired functionality, some designers may employ a design logic verification process to verify that the logical design meets specified design requirements. For example, a designer may create rules such as, e.g., every transistor gate in the design must have an electrical path to ground that passes through no more than three other devices, or every transistor that connects to a specified power supply also must be connected to a corresponding ground node, and not to any other ground node. A design logic verification process then will determine if a logical design complies with specified rules, and identify occurrences where it does not.

After the logical design is deemed satisfactory, it is converted into physical design data by synthesis software. This physical design data or "layout" design data may represent, for example, the geometric elements that will be written onto a mask used to fabricate the desired microcircuit device in a photolithographic process at a foundry. For conventional mask or reticle writing tools, the geometric elements typically will be polygons of various shapes. Thus, the layout design data usually includes polygon data describing the features of polygons in the design. It is very important that the physical design information accurately embody the design specification and logical design for proper operation of the device. Accordingly, after it has been created during a synthesis process, the physical design data is compared with the original logical design schematic in a process sometimes referred to as a "layout-versus-schematic" (LVS) process.

Once the correctness of the logical design has been verified, and geometric data corresponding to the logical design has been created in a layout design, the geometric data then may be analyzed. For example, because the physical design data is employed to create masks used at a foundry, the data must conform to the foundry's requirements. Each foundry specifies its own physical design parameters for compliance with their processes, equipment, and techniques. Accordingly, the design flow may include a process to confirm that the design data complies with the specified parameters. During this process, the physical layout of the circuit design is compared with design rules in a process commonly referred to as a "design rule check" (DRC) process. In addition to rules specified by the foundry, the design rule check process may also check the physical layout of the circuit design against other design rules, such as those obtained from test chips, general knowledge in the industry, previous manufacturing experience, etc.

With modern electronic design automation design flows, a designer may additionally employ one or more "design-for-manufacture" (DFM) software tools. As previously noted, design rule check processes attempt to identify, e.g., elements representing structures that will almost certainly be improperly formed during a manufacturing process. "Design-For-Manufacture" tools, however, provide processes that attempt to identify elements in a design representing structures with a significant likelihood of being improperly formed during the manufacturing process. A "design-for-manufacture" process may additionally determine what impact the improper formation of the identified elements will have on the yield of devices manufactured from the circuit design, and/or modifications that will reduce the likelihood that the identified elements will be improperly formed during the manufacturing process. For example, a "design-for-manufacture" (DFM) software tool may identify wires that are connected by only a single via, determine the yield impact for manufacturing a circuit from the design based upon the probability that each individual single via will be improperly formed during the manufacturing process, and then identify areas where redundant vias can be formed to supplement the single vias.

It should be noted that, in addition to "design-for-manufacture," various alternate terms are used in the electronic design automation industry. Accordingly, as used herein, the term "design-for-manufacture" or "design-for-manufacturing" is intended to encompass any electronic design automation process that identifies elements in a design representing structures that may be improperly formed during the manufacturing process. Thus, "design-for-manufacture" (DFM) software tools will include, for example, "lithographic friendly design" (LFD) tools that assist designers to make trade-off decisions on how to create a circuit design that is more robust and less sensitive to lithographic process windows. They will also include "design-for-yield" (DFY) electronic design automation tools, "yield assistance" electronic design automation tools, and "chip cleaning" and "design cleaning" electronic design automation tools.

After a designer has used one or more geometry analysis processes to verify that the physical layout of the circuit design is satisfactory, the designer may then perform one or more simulation processes to simulate the operation of a manufacturing process, in order to determine how the design will actually be realized by that particular manufacturing process. A simulation analysis process may additionally modify the design to address any problems identified by the simulation. For example, some design flows may employ one or more processes to simulate the image formed by the physical layout of the circuit design during a photolithographic process, and then modify the layout design to improve the resolution of the image that it will produce during a photolithography process.

These resolution enhancement techniques (RET) may include, for example, modifying the physical layout using optical proximity correction (OPC) or by the addition of sub-resolution assist features (SRAF). Other simulation analysis processes may include, for example, phase shift mask (PSM) simulation analysis processes, etch simulation analysis processes and planarization simulation analysis processes. Etch simulation analysis processes simulate the removal of materials during a chemical etching process, while planarization simulation processes simulate the polishing of the circuit's surface during a chemical-mechanical etching process. These simulation analysis processes may identify, for example, regions where an etch or polishing process will not leave a sufficiently planar surface. These simulation analysis processes may then modify the physical layout design to, e.g., include more geometric elements in those regions to increase their density.

Once a physical layout design has been finalized, the geometric elements in the design are formatted for use by a mask or reticle writing tool. Masks and reticles typically are made using tools that expose a blank reticle or mask substrate to an electron or laser beam (or to an array of electron beams or laser beams), but most mask writing tools are able to only "write" certain kinds of polygons, however, such as right triangles, rectangles or other trapezoids. Moreover, the sizes of the polygons are limited physically by the maximum beam (or beam array) size available to the tool. Accordingly, the larger geometric elements in a physical layout design data will typically be "fractured" into the smaller, more basic polygons that can be written by the mask or reticle writing tool.

It should be appreciated that various design flows may repeat one or more processes in any desired order. Thus, with some design flows, geometric analysis processes can be interleaved with simulation analysis processes and/or logical analysis processes. For example, once the physical layout of the circuit design has been modified using resolution enhancement techniques, then a design rule check process or design-for-manufacturing process may be performed on the modified layout, Further, these processes may be alternately repeated until a desired degree of resolution for the design is obtained. Similarly, a design rule check process and/or a design-for-manufacturing process may be employed after an optical proximity correction process, a phase shift mask simulation analysis process, an etch simulation analysis process or a planarization simulation analysis process.

Examples of electronic design tools that employ one or more of the logical analysis processes, geometry analysis processes or simulation analysis processes discussed above are described in U.S. Pat. No. 6,230,299 to McSherry et al., issued May 8, 2001, U.S. Pat. No. 6,249,903 to McSherry et al., issued Jun. 19, 2001, U.S. Pat. No. 6,339,836 to Eisenhofer et al., issued Jan. 15, 2002, U.S. Pat. No. 6,397,372 to Bozkus et al., issued May 28, 2002, U.S. Pat. No. 6,415,421 to Anderson et al., issued Jul. 2, 2002, and U.S. Pat. No. 6,425,113 to Anderson et al., issued Jul. 23, 2002, each of which are incorporated entirely herein by reference.

Software Tools for Simulation, Verification or Modification of a Circuit Layout

To facilitate an understanding of various embodiments of the invention, one such software tool for automatic design automation, directed to the analysis and modification of a design for an integrated circuit, will now be generally described. As previously noted, the terms "design" and "design data" are used herein to encompass data describing an entire microdevice, such as an integrated circuit device or micro-electromechanical system (MEMS) device. These terms also are intended, however, to encompass a smaller set of data describing one or more components of an entire microdevice, such as a layer of an integrated circuit device, or even a portion of a layer of an integrated circuit device. Still further, the terms "design" and "design data" also are intended to encompass data describing more than one microdevice, such as data to be used to create a mask or reticle for simultaneously forming multiple microdevices on a single wafer. As also previously noted, unless otherwise specified, the term "design" as used herein is intended to encompass any type of design, including both physical layout designs and logical designs.

Figure 3:
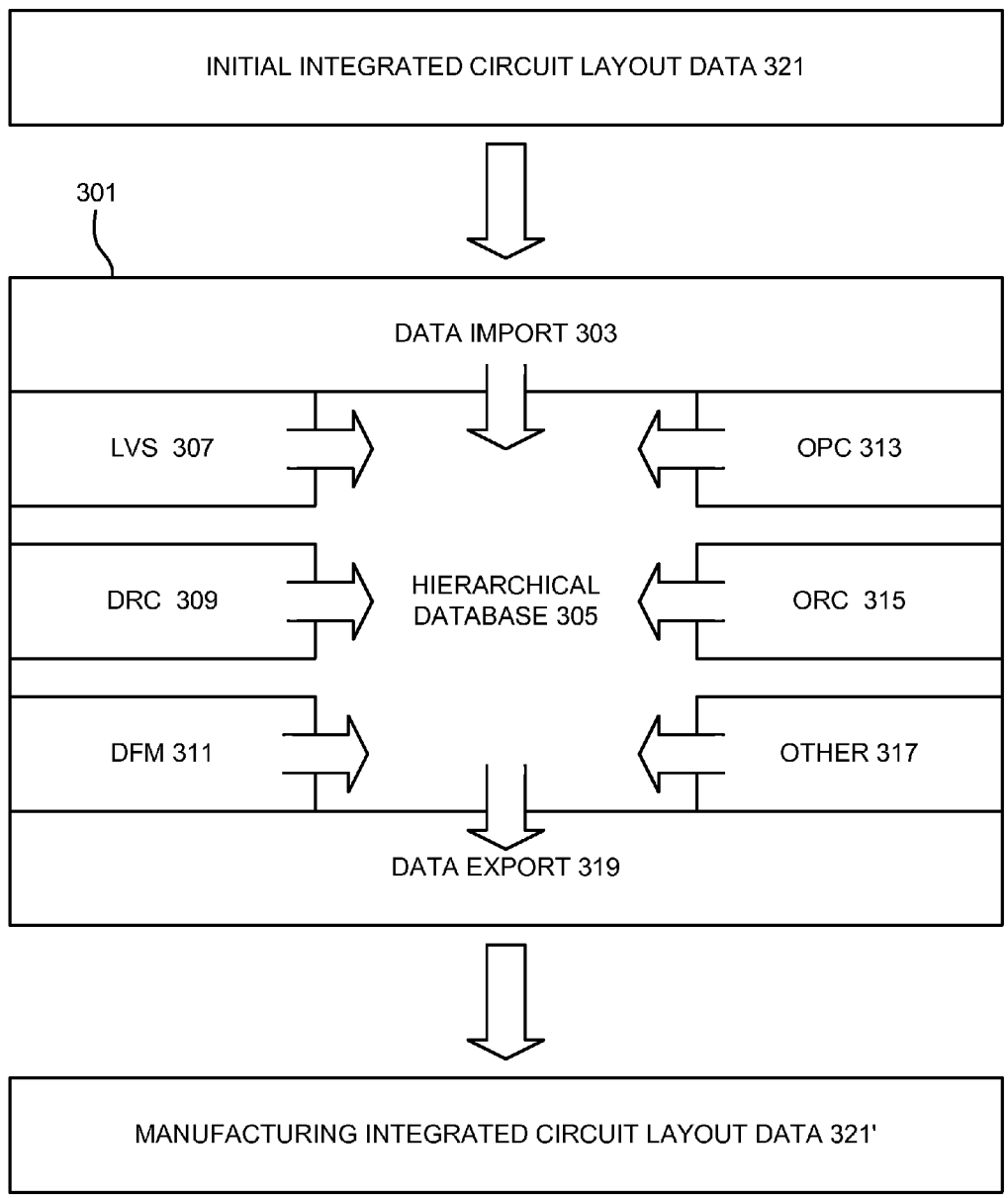
FIG. 3 schematically illustrates an example of a family of software tools for physical verification that may employ error waiver techniques according to various embodiments of the invention.

As seen in FIG. 3, an analysis tool 301, which may be implemented by a variety of different software applications, includes a data import module 303 and a hierarchical database 305. The analysis tool 301 also includes a layout-versus-schematic (LVS) verification module 307, a design rule check (DRC) module 309, a design-for-manufacturing (DFM) module 311, an optical proximity correction (OPC) module 313, and an optical proximity rule check (ORC) module 315. The analysis tool 301 may further include other modules 317 for performing additional functions as desired, such as a phase shift mask (PSM) module (not shown), an etch simulation analysis module (not shown) and/or a planarization simulation analysis module (not shown). The tool 301 also has a data export module 319. One example of such an analysis tool is the Calibre family of software applications available from Mentor Graphics Corporation of Wilsonville, Oreg.

Initially, the tool 301 receives data 321 describing a physical layout design for an integrated circuit. The layout design data 321 may be in any desired format, such as, for example, the Graphic Data System II (GDSII) data format or the Open Artwork System Interchange Standard (OASIS) data format proposed by Semiconductor Equipment and Materials International (SEMI). Other formats for the data 321 may include an open source format named OpenAccess, Milkyway by Synopsys, Inc., and EDDM by Mentor Graphics, Inc. The layout data 321 includes geometric elements for manufacturing one or more portions of an integrated circuit device. For example, the initial integrated circuit layout data 321 may include a first set of polygons for creating a photolithographic mask that in turn will be used to form an isolation region of a transistor, a second set of polygons for creating a photolithographic mask that in turn will be used to form a contact electrode for the transistor, and a third set of polygons for creating a photolithographic mask that in turn will be used to form an interconnection line to the contact electrode. The initial integrated circuit layout data 321 may be converted by the data import module 303 into a format that can be more efficiently processed by the remaining components of the tool 301.

Once the data import module 303 has converted the original integrated circuit layout data 321 to the appropriate format, the layout data 321 is stored in the hierarchical database 305 for use by the various operations executed by the modules 305-317. Next, the layout-versus-schematic module 307 checks the layout design data 321 in a layout-versus-schematic process, to verify that it matches the original design specifications for the desired integrated circuit. If discrepancies between the layout design data 321 and the logical design for the integrated circuit are identified, then the layout design data 321 may be revised to address one or more of these discrepancies. Thus, the layout-versus-schematic process performed by the layout-versus-schematic module 307 may lead to a new version of the layout design data with revisions. According to various implementations of the invention tool 301, the layout data 321 may be manually revised by a user, automatically revised by the layout-versus-schematic module 307, or some combination thereof.

Next, the design rule check module 309 confirms that the verified layout data 321 complies with defined geometric design rules. If portions of the layout data 321 do not adhere to or otherwise violate the design rules, then the layout data 321 may be modified to ensure that one or more of these portions complies with the design rules. The design rule check process performed by the design rule check module 309 thus also may lead to a new version of the layout design data with various revisions. Again, with various implementations of the invention tool 301, the layout data 321 may be manually modified by a user, automatically modified by the design rule check module 309, or some combination thereof.

The modified layout data 321 is then processed by the design for manufacturing module 311. As previously noted, a "design-for-manufacture" processes attempts to identify elements in a design representing structures with a significant likelihood of being improperly formed during the manufacturing process. A "design-for-manufacture" process may additionally determine what impact the improper formation of the identified structures will have on the yield of devices manufactured from the circuit design, and/or modifications that will reduce the likelihood that the identified structures may be improperly formed during the manufacturing process. For example, a "design-for-manufacture" (DFM) software tool may identify wires that are connected by single vias, determine the yield impact based upon the probability that each individual single via will be improperly formed during the manufacturing process, and then identify areas where redundant visa can be formed to supplement the single vias.

The processed layout data 321 is then passed to the optical proximity correction module 313, which corrects the layout data 321 for manufacturing distortions that would otherwise occur during the lithographic patterning. For example, the optical proximity correction module 313 may correct for image distortions, optical proximity effects, photoresist kinetic effects, and etch loading distortions. The layout data 321 modified by the optical proximity correction module 313 then is provided to the optical process rule check module 315

The optical process rule check module 315 (more commonly called the optical rules check module or ORC module) ensures that the changes made by the optical proximity correction module 313 are actually manufacturable, a "downstream-looking" step for layout verification. This compliments the "upstream-looking" step of the LVS performed by the LVS module 307 and the self-consistency check of the DRC process performed by the DRC module 309, adding symmetry to the verification step. Thus, each of the processes performed by the design for manufacturing process 311, the optical proximity correction module 313, and the optical process rule check module 315 may lead to a new version of the layout design data with various revisions.

As previously noted, other modules 317 may be employed to perform alternate or additional manipulations of the layout data 321, as desired. For example, some implementations of the tool 301 may employ, for example, a phase shift mask module. As previously discussed, with a phase-shift mask (PSM) analysis (another approach to resolution enhancement technology (RET)), the geometric elements in a layout design are modified so that the pattern they create on the reticle will introduce contrast-enhancing interference fringes in the image. The tool 301 also may alternately or additionally employ, for example, an etch simulation analysis processes or a planarization simulation analysis processes. The process or processes performed by each of these additional modules 317 may also lead to the creation of a new version of the layout data 321 that includes revisions.

After all of the desired operations have been performed on the initial layout data 321, the data export module 319 converts the processed layout data 321 into manufacturing integrated circuit layout data 323 that can be used to form one or more masks or reticles to manufacture the integrated circuit (that is, the data export module 319 converts the processed layout data 321 into a format that can be used in a photolithographic manufacturing process). Masks and reticles typically are made using tools that expose a blank reticle or mask substrate to an electron or laser beam (or to an array of electron beams or laser beams), but most mask writing tools are able to only "write" certain kinds of polygons, however, such as right triangles, rectangles or other trapezoids. Moreover, the sizes of the polygons are limited physically by the maximum beam (or beam array) size available to the tool.

Accordingly, the data export module 319 may "fracture" larger geometric elements in the layout design, or geometric elements that are not right triangles, rectangles or trapezoids (which typically are a majority of the geometric elements in a layout design) into the smaller, more basic polygons that can be written by the mask or reticle writing tool. Of course, the data export module 319 may alternately or additionally convert the processed layout data 321 into any desired type of data, such as data for use in a synthesis process (e.g., for creating an entry for a circuit library), data for use in a place-and-route process, data for use in calculating parasitic effects, etc. Further, the tool 301 may store one or more versions of the layout 321 containing different modifications, so that a designer can undo undesirable modifications. For example, the hierarchical database 305 may store alternate versions of the layout data 321 created during any step of the process flow between the modules 307-317.

Data Organization

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells.

By categorizing microcircuit design data into hierarchical cells, large data structures can be processed more quickly and efficiently. For example, a circuit designer typically will analyze a design to ensure that each circuit feature described in the design complies with specified design rules. With the above example, instead of having to analyze each feature in the entire 128 kB memory array, a design rule check process can analyze the features in a single bit cell. If the cells are identical, then the results of the check will then be applicable to all of the single bit cells. Once it has confirmed that one instance of the single bit cells complies with the design rules, the design rule check process then can complete the analysis of a register cell simply by analyzing the features of its additional miscellaneous circuitry (which may itself be made of up one or more hierarchical cells). The results of this check will then be applicable to all of the register cells. Once it has confirmed that one instance of the register cells complies with the design rules, the design rule check software application can complete the analysis of the entire 128 kB memory array simply by analyzing the features of the additional miscellaneous circuitry in the memory array. Thus, the analysis of a large data structure can be compressed into the analyses of a relatively small number of cells making up the data structure.

With various examples of the invention, layout design data may include two different types of data: "drawn layer" design data and "derived layer" design data. The drawn layer data describes geometric elements that will be used to form structures in layers of material to produce the integrated circuit. The drawn layer data will usually include polygons that will be used to form structures in metal layers, diffusion layers, and polysilicon layers. The derived layers will then include features made up of combinations of drawn layer data and other derived layer data. Thus, with a transistor gate, derived layer design data describing the gate may be derived from the intersection of a polygon in the polysilicon material layer and a polygon in the diffusion material layer.

For example, a design rule check process performed by the design rule check module 309 typically will perform two types of operations: "check" operations that confirm whether design data values comply with specified parameters, and "derivation" operations that create derived layer data. A transistor gate design data thus may be created by the following derivation operation:

gate=diff AND poly

The results of this operation will be a "layer" of data identifying all intersections of diffusion layer polygons with polysilicon layer polygons. Likewise, a p-type transistor gate, formed by doping the diffusion layer with n-type material, is identified by the following derivation operation:

pgate=nwell AND gate

The results of this operation then will be another "layer" of data identifying all transistor gates (i.e., intersections of diffusion layer polygons with polysilicon layer polygons) where the polygons in the diffusion layer have been doped with n-type material.

A check operation performed by the design rule check module 309 will then define a parameter or a parameter range for a data design value. For example, a user may want to ensure that no metal wiring line is within a micron of another wiring line. This type of analysis may be performed by the following check operation:

external metal<1

The results of this operation will identify each polygon in the metal layer design data that are closer than one micron to another polygon in the metal layer design data.

Also, while the above operation employs drawn layer data, check operations may be performed on derived layer data as well. For example, if a user wanted to confirm that no transistor gate is located within one micron of another gate, the design rule check process might include the following check operation:

external gate<1

The results of this operation will identify all gate design data representing gates that are positioned less than one micron from another gate. It should be appreciated, however, that this check operation cannot be performed until a derivation operation identifying the gates from the drawn layer design data has been performed.

Error Waiver Process

Various implementations of the invention provide techniques for recording information reflecting the waiver of a false error generated by a verification rule during a verification rule check process, and for using the recorded waiver information to avoid registering the false error in subsequent checks of that verification rule. With various examples of the invention, a designer may employ a conventional verification rule check process, such as a design-rule-check process or design-for-manufacturing-rule-check process, to verify that the physical layout design for an integrated circuit complies with one or more design verification rules. In response, the verification rule check process will identify one or more errors in the physical layout design where the design violates at least one of the verification rule.

After examining the identified errors, a designer may designate one or more of the identified errors as false errors. In response, various implementations of the invention will create waiver geometric elements corresponding to the designated false errors, and add these waiver geometric elements to the design. As will be explained in more detail below, the waiver geometric element is associated with the verification rule that generated its corresponding false error. When the design is subsequently analyzed using those verification rules in another verification rule check process, the waiver geometric elements are examined, and used to mask those errors associated with a waiver geometric element that would otherwise be displayed to the designer. Some implementations of the invention, however, may also create a separate data file with the waived errors, to allow the designer the option of a final check of the waived errors before tapeout of the design.

With some implementations of the invention, the physical shape of a waiver geometric element will correspond to the shape of its corresponding false error. For example, if the false error is a spacing violation between adjacent geometric elements, then the shape of the corresponding waiver geometric element will match the shape of the offending space between the adjacent geometric elements. Also, some implementations of the invention may associate geometric elements in the design with the appropriate waiver geometric element based upon the rule used to create the waiver geometric element. For example, with some implementations of the invention, waiver geometric elements are placed in a hierarchical cell corresponding to the verification rule that generated the error being waived. The cell name then may have, e.g., the corresponding verification rule name incorporated within or associated with it. In this manner, all of the cells (and thus all of the waiver geometric elements) can be contained in a single derived design layer. When a verification rule is checked in a subsequent verification rule check process, the waiver geometric elements from the cell corresponding to that verification rule name can then be extracted and applied to the design.

Still further, with some implementations of the invention, the waiver geometric elements may have an adjustable scope. For example, some implementations of the invention may allow a user to designate tolerances specifying the amount (e.g., in area) of an error that must be covered by a waiver geometric element before the error is waived, the amount (e.g., in area) of the waiver geometric element that must be covered by the error for the error to be waived, or both. More particularly, some implementations of the invention may allow a user to select, e.g., two percentages specifying how much area overlap must occur in each situation before the error is waived. Still other implementations of the invention may alternately or additionally quantify similarities between identified error and corresponding waiver geometric element in order to determine when an error should be waived. It also should be noted that, for simplicity and clarity, some implementations of the invention may prohibit a user from "cutting-out" just a portion of a larger error corresponding to a waiver geometric element.

Still further, some implementations of the invention can capture properties of a waived error. For example, some implementations of the invention may record what waiver geometric element/error overlap percentages caused the error to be waived. This may allow, e.g., a designer to subsequently examine waived errors that were relatively close to the threshold amount.

Additionally or alternatively, some embodiments of the invention allow a designer or a manufacturer to designate waiver regions and waiver items in a layout design without conducting a verification rule check process. Waiver regions are areas in a layout design in which some or all design errors may be designated as false errors. Various approaches may be applied to identify waiver regions. With some implementations of the invention, waiver regions may be located using pattern matching techniques. A designer or a manufacture may provide a reference pattern of layout geometries across one or more layers. A pattern matching technique may then be applied to search for layout patterns in a layout design that match the reference pattern. The identified layout patterns are the waiver regions associated with the reference pattern. As the waiver regions are identified by using the reference pattern, the reference pattern is referred to as a waiver region identification item. Once a waiver region is identified, one or more waiver items are placed. The one or more waiver items and corresponding design verification rules may be used to determine whether the design errors found in the waiver region are false design errors. This process is similar to the process discussed above in which waiver regions and waiver items are determined after conducting a verification rule check process. In the methods based on verification rule check, names of the cells that contain waiver geometric elements serve as waiver region identification items and waiver geometric elements serve as waiver items.

Also similar to the process based on conducting a verification rule check process, the process based on pattern matching may use waiver data to associate waiver region identification items with waiver items and with corresponding design verification rules. Accordingly, the waiver data for both processes may be stored in a single data structure such as a data file or a derived design layer. It should be noted that in some embodiments of the invention, the waiver region identification items and the waiver items are not separated: the waiver region identification items may comprise the waiver items, or vice versa.

In addition to reference patterns for pattern matching, cell names and markers may be used to locate waiver regions and serve as the waiver region identification items. A designer may designate some or all design errors within a cell or a layout region identified by a layout marker (marker) as false design errors. In this situation, the boundary of the cell or the layout region may form a waiver item. Again, the waiver data associating the waiver region identification items with the waiver items and with the design verification rules can be stored in a single data structure such as a data file or a derived design layer. They can be combined with those based on pattern matching and on verification rule checking.

With some implementations of the invention, a verification rule check process may be conducted only in layout areas determined based on waiver items associated with each design verification rule. For example, if layout features are within a cell boundary or overlapped with the cell by at least a certain percentage, these layout features may not be checked by one or more design verification rules associated with the cell.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:
1. A method of waiving design errors, comprising:
by a computing device:
receiving layout design data for a layout design;
receiving at least one waiver region identification item for identifying regions of layout design data in which one or more detected design errors are to be desig- nated as false errors to be waived from being reported during physical verification;
employing the at least one waiver region identification item to identify regions in the received layout design data; and
modifying the received layout design data to include waiver items associated with the identified waiver regions;
designating the identified regions of the received layout design data as waiver regions in which the one or more detected design errors are to be designated as false errors.

2. The method recited in claim 1, wherein the waiver items are stored together using a data structure.

3. The method recited in claim 2, wherein the data structure is a derived design layer.

4. The method recited in claim 1, further comprising:
performing an electronic design automation process on the modified layout design to produce analysis results including one or more design errors, the design errors being one or more errors identified in the layout design; and
determining whether one or more of the design errors are false design errors using the waiver items.

5. The method recited in claim 4, further comprising: storing the false design errors separately from rest of the one or more design errors.

6. The method recited in claim 4, wherein the electronic design automation process comprises a Design Rule Check (DRC) process.

7. The method recited in claim 1, wherein
the waiver region identification item comprises a reference pattern for pattern matching; and
employing the waiver region identification item to identify regions in the received layout design data includes identifying patterns in the received layout design data that matches the reference pattern.

8. The method recited in claim 1, wherein the waiver region identification item comprises at least one cell name.

9. The method recited in claim 4, further comprising: masking the false design errors.

10. The method recited in claim 1, wherein the waiver items are stored geometric elements.

11. One or more computer-readable storage devices storing computer-executable instructions that when executed by a processor, cause the processor to perform a method of waiving design errors, the method comprising:
receiving layout design data for a layout design;
receiving a waiver region identification item for identifying regions of layout design data in which one or more detected design errors are to be designated as false errors, the waiver region identification item being associated with a waiver geometric element and/or one or more verification rules;
employing the waiver region identification item to identify at least one waiver region in the received layout design data;
modifying the received layout design data to include waiver items designating the identified regions of the received layout design data as waiver regions in which one or more detected design errors are to be designated as false errors;

performing a physical verification process on the modified layout design to produce analysis results based on the modified layout design data; and
determining whether one or more of the design errors are false design errors based on the performed analysis results using the waiver region.

12. The computer-readable storage media recited in claim 11, wherein:
the waiver region identification item comprises a reference pattern for pattern matching; and
the employing the waiver region identification item to identify regions in the received layout design data includes identifying patterns in the received layout design data that matches the reference pattern.

13. The computer-readable storage media recited in claim 11, wherein the waiver region identification item comprises at least one cell name.

14. The computer-readable storage media recited in claim 11, wherein the waiver region identification items are stored geometric elements.

15. The computer-readable storage media recited in claim 11, wherein the received waiver region identification item is designated without conducting a verification rule check process.

16. A system, comprising:
one or more processors;
memory coupled to the processors;
one or more computer-readable storage media storing computer-executable instructions that when executed by the processors, cause the processors to perform a method of waiving design errors in layout design data for a layout design, the method comprising:
identifying regions in the layout design using waiver region identification items, the waiver region identification items identifying regions of the layout design in which one or more design errors are to be designated as false errors;
modifying the received layout design data to include waiver items that are associated with the identified waiver regions;
designating the identified regions of the received layout design data as waiver regions;
performing an electronic design automation process on the modified layout design to produce analysis results including one or more design errors, the design errors being one or more errors identified in the layout design; and
determining whether one or more of the design errors are false design errors using the waiver items.

17. The system of claim 16, wherein:
the waiver region identification item comprises a reference pattern for pattern matching; and
the modifying the received layout design comprises identifying patterns in the received layout design data that matches the reference pattern.

18. The system of claim 16, wherein the waiver region identification item comprises at least one cell name.

19. The system of claim 16, wherein the waiver items are stored geometric elements.

20. The system of claim 16, wherein the received waiver region identification items were generated without conducting a design rule check process.

* * * * *